US006548936B2

(12) United States Patent
Kodama et al.

(10) Patent No.: US 6,548,936 B2
(45) Date of Patent: Apr. 15, 2003

(54) ELASTIC WAVE CONTROL ELEMENT USING PIEZOELECTRIC MATERIALS

(75) Inventors: Hidekazu Kodama, Tokyo (JP); Fumitaka Funahashi, Tokyo (JP); Munehiro Date, Tokyo (JP); Eiichi Fukada, Tokyo (JP); Tomonao Okubo, Tokyo (JP); Kazunori Kimura, Tokyo (JP)

(73) Assignees: Rion Co., Ltd., Tokyo (JP); Kobayasi Institute of Physical Research, Tokyo (JP)

( * ) Notice: Subject to any disclaimer, the term of this patent is extended or adjusted under 35 U.S.C. 154(b) by 0 days.

(21) Appl. No.: 09/924,752

(22) Filed: Aug. 8, 2001

(65) Prior Publication Data

US 2002/0021057 A1 Feb. 21, 2002

(30) Foreign Application Priority Data

Aug. 10, 2000 (JP) ...................................... 2000-243078
May 21, 2001 (JP) ...................................... 2001-151371

(51) Int. Cl.[7] ............................................... H01L 41/08
(52) U.S. Cl. .................................. 310/316.01; 310/319
(58) Field of Search ................................ 310/311, 320, 310/325, 326, 316.01, 316.02, 317, 319, 328

(56) References Cited

U.S. PATENT DOCUMENTS 3,699,484 A * 10/1972 Berlincourt ................. 310/320
3,710,148 A * 1/1973 Itoh .......................... 307/295
4,158,787 A * 6/1979 Forward ................. 310/319 X
4,199,989 A * 4/1980 Forward et al. .............. 73/430
4,365,181 A * 12/1982 Yamamoto .................. 310/320
5,544,662 A * 8/1996 Saulnier et al. ............. 128/734
5,558,477 A * 9/1996 Browning et al. .......... 408/143
6,018,210 A * 1/2000 Date et al. .................. 310/311
6,121,940 A * 9/2000 Skahill et al. .............. 343/860

FOREIGN PATENT DOCUMENTS

JP 10074990 A 8/1996

* cited by examiner

*Primary Examiner*—Mark O. Budd
(74) *Attorney, Agent, or Firm*—Carrier, Blackman & Associates, P.C.; Joseph P. Carrier; William D. Blackman

(57) ABSTRACT

An elastic wave control element includes a piezoelectric material which is inserted into a propagation path for an elastic wave or installed in an oscillator to allow the elastic wave in a selected frequency to be damped, reflected, or transmitted. The piezoelectric material is provided with a pair of electrodes between which a negative capacitance circuit is connected to allow a loss factor of the negative capacitance circuit in a selected frequency or frequency band to be matched with a dielectric loss factor of the piezoelectric material.

20 Claims, 10 Drawing Sheets

(a)

(b)

(a)

(b)

(a)

(b)

ELASTIC WAVE CONTROL ELEMENT USING PIEZOELECTRIC MATERIALS

BACKGROUND OF THE INVENTION

1. Field of the Invention

The present invention relates to an elastic wave control element using a piezoelectric material which can be inserted into a propagation path for elastic waves or installed in an oscillator to allow the elastic waves in a selected frequency or in a selected frequency band to be damped, reflected or transmitted.

2. Description of the Prior Art

As methods for absorbing elastic waves such as a sound or vibration which is propagated through an elastic substance, there are sound absorption by glass-wool or the like and vibration damping using a damper or the like. In these methods, the energy of the elastic waves is changed to thermal energy through an elastic loss such as that from use of a sound absorption material and a damper. Therefore, the elastic waves are damped by consuming the thermal energy.

Further, as methods for reflecting the elastic waves, there are sound insulation by concrete or the like, vibration damping using a spring, and the like. Usually, in elastic waves which are propagated through gas or liquid, a reflection effect can be increased by using a large mass or elastic constant. On the other hand, in elastic waves which are propagated through a solid body, vibration transmission rate can be decreased by using a small elastic constant.

In this manner, a method in which a different kind of material is inserted into a medium which propagates the elastic waves or installed in an elastic substance to allow the elastic waves to be absorbed or reflected is called passive control. In this method, a damping factor, a reflection factor, and a transmission factor (i.e. vibration transmission rate) depend on the elastic constant and the elastic loss of the different kind of material.

On the other hand, an active control method which involves a sensor, an operation part, a controller and an actuator has also been used recently. This active control method is characterized in that, when the sensor senses the elastic waves, the actuator is driven through the operation part and the controller to damp the elastic waves.

However, in the passive control method, the damping factor, the reflection factor, the transmission factor (i.e. the vibration transmission rate), and their frequency characteristics are mainly determined by the size, shape, elastic constant, and elastic loss of the different kinds of materials. Accordingly, those characteristics depend on temperature and pressure, but could not be changed artificially.

Further, in the active control method, a complicated system and control method are required to obtain sufficient effect.

On the other hand, if an element which can freely change the damping factor, the reflection factor, the transmission factor (i.e. the vibration transmission rate) was available and wherein those frequency characteristics can be realized using a simple system, it is considered that the element will be widely applicable in many different fields because the elastic wave can be freely damped, reflected, or transmitted in a selective frequency band.

SUMMARY OF THE INVENTION

It is an object of the present invention to overcome the above-mentioned problems found in the prior art and to provide an elastic wave control element using a piezoelectric material of a simple construction which can easily change a damping factor, a reflection factor, a transmission factor (i.e. a vibration transmission rate), and their frequency characteristics, and which can not only damp, reflect or transmit elastic waves in a specified frequency or a selected frequency band, but also compensate those temperature characteristics.

To attain the object above, according to a first aspect of the invention, an elastic wave control element is provided which is inserted into transmission path for the elastic waves and installed in an oscillator to allow the elastic waves in a selected frequency to be damped, reflected, or transmitted, and comprising a piezoelectric material provided with a pair of electrodes between which a negative capacitance circuit is connected to allow the capacitance and loss factor of the negative capacitance circuit and their frequency characteristics to be changed selectively, and to allow the loss factor of the negative capacitance circuit in a selected frequency to be matched with a dielectric loss factor of the piezoelectric material.

According to a second aspect of the invention, an elastic wave control element is provided which is inserted into a propagation path for elastic waves or installed in an oscillator to allow the elastic waves in a selected frequency band to be damped, reflected or transmitted, and comprising a piezoelectric material provided with a pair of electrodes between which a negative capacitance circuit is connected to allow the capacitance and loss factor of the negative capacitance circuit and their frequency characteristics and temperature characteristics to be changed selectively and to allow frequency characteristics and temperature characteristics of an absolute value of the capacitance and the loss factor of the negative capacitance circuit to be matched with frequency characteristics and temperature characteristics of the capacitance and the loss factor of the piezoelectric material in a selected frequency band and temperature range.

According to a third aspect of the invention, an elastic wave control element is provided which is inserted in a propagation path for elastic waves or installed in an oscillator to allow the elastic waves in a selected frequency band to be damped, reflected, or transmitted, and comprising a piezoelectric element provided with a pair of electrodes between which a negative capacitance circuit is connected to allow the capacitance and loss factor of the negative capacitance circuit and their frequency characteristics to be changed selectively, and to allow the frequency characteristics of an absolute value of the capacitance and the loss factor of the negative capacitance circuit to be matched with the frequency characteristics of capacitance and the loss factor of the piezoelectric material in a selected frequency band.

According to a fourth aspect of the invention, an elastic wave control element is provided which is inserted into a propagation path for elastic waves and installed in an oscillator to allow the elastic waves in a selected frequency or frequency band to be damped, reflected or transmitted, and comprising a piezoelectric material provided with a pair of electrodes between which a negative capacitance circuit is connected to allow capacitance and loss factor of the negative capacitance circuit and their temperature characteristics to be changed selectively, and to allow temperature characteristics of an absolute value of the capacitance and the loss factor of the negative capacitance circuit to be matched with temperature characteristics of the capacitance and the loss factor of the piezoelectric material in a selected temperature range.

According to a fifth aspect of the invention, the elastic wave control element using the piezoelectric material as discussed above, in which an element of the negative capacitance circuit, for determining a loss factor, is made of the same material as the piezoelectric material.

According to a sixth aspect of the invention, the elastic wave control element using the piezoelectric material as discussed above, in which an element, for determining a loss factor, among elements forming the negative capacitance circuit forms a network using at least one of a resistor, a condenser, and a coil.

According to a seventh aspect of the invention, the elastic wave control element using the piezoelectric material as discussed above is constructed such that at least one of the elements forming the network is made of the same material as the piezoelectric material.

According to an eighth aspect of the invention, the elastic wave control element using the piezoelectric material as discussed above is constructed such that the resistor of the network is variable to allow the frequency characteristics of the capacitance and loss factor of the negative capacitance circuit to be variable.

According to a ninth aspect of the invention, the elastic wave control element using the piezoelectric material as discussed above, further comprises combined elements formed by connecting three elements to the piezoelectric material. The combined elements are connected to the negative capacitance circuit, and the three combined elements form a network, and include at least one of a resistor, a condenser, and a coil.

According to a tenth aspect of the invention, the elastic wave control element using the piezoelectric material as discussed above is construed such that one of the three combined elements is opened, or at least one of the other two elements is short-circuited.

BRIEF DESCRIPTION OF THE DRAWINGS

The above and other objects, features and advantages of the present invention will become more apparent from the following description when taken in conjunction with the accompanying drawings.

DETAILED DESCRIPTION OF THE PREFERRED EMBODIMENTS

Figure 1:
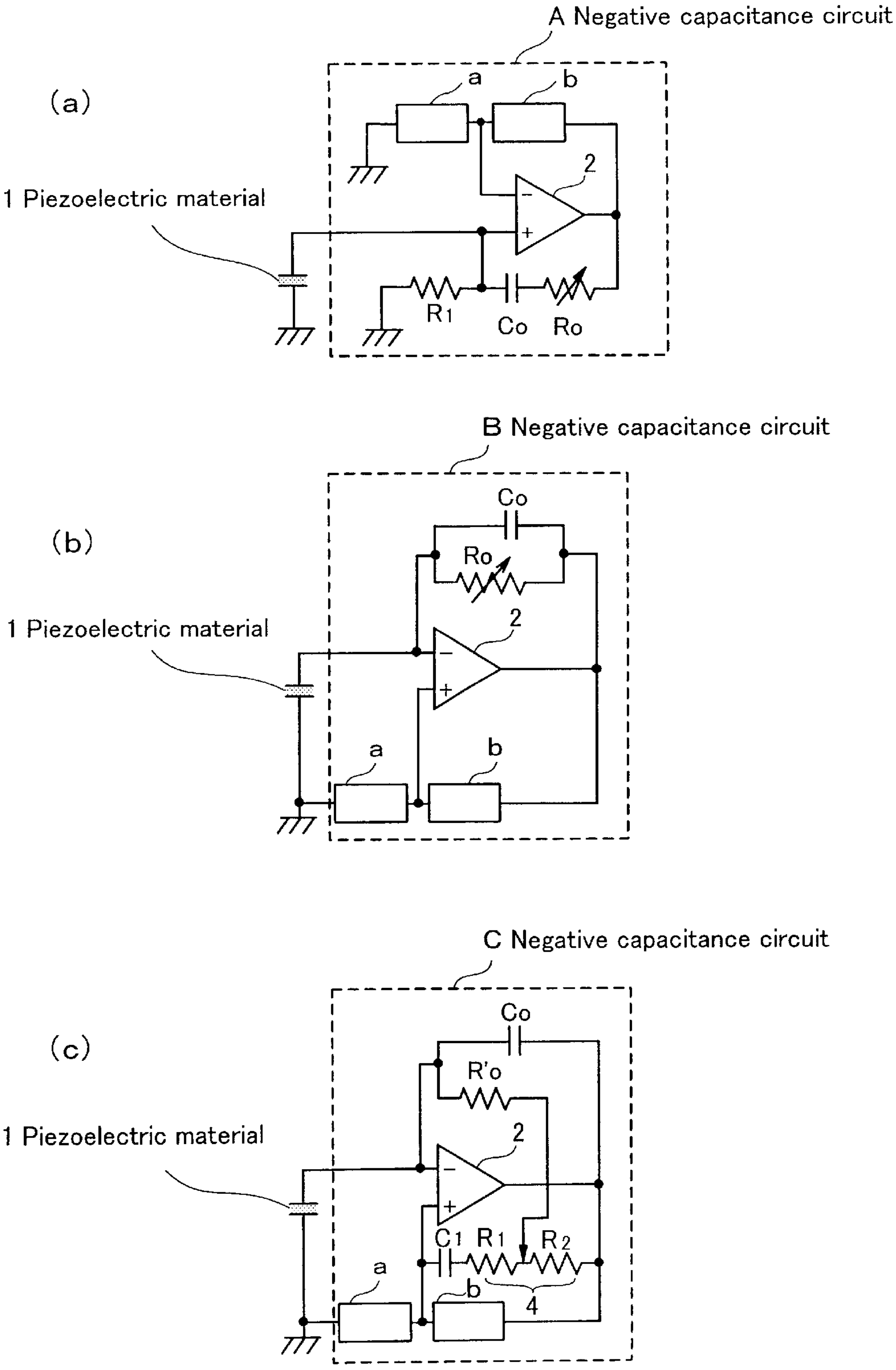
FIGS. 1(*a*)–1(*c*) are schematic diagrams of a first embodiment of the present invention, in which FIG. 1(*a*) is a schematic diagram of an elastic wave control element using a negative capacitance circuit A, FIG. 1(*b*) is a schematic diagram of an elastic wave control element using a negative capacitance circuit B, and FIG. 1(*c*) is a schematic diagram of an elastic wave control element using a negative capacitance circuit C.
Figure 2:
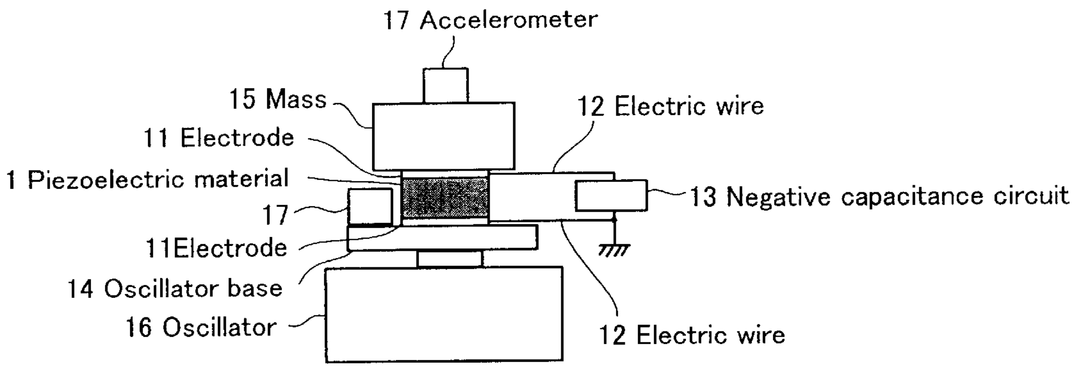
FIG. 2 is a view explaining a method of measuring vibration characteristics in the first embodiment of the invention.
Figure 3:
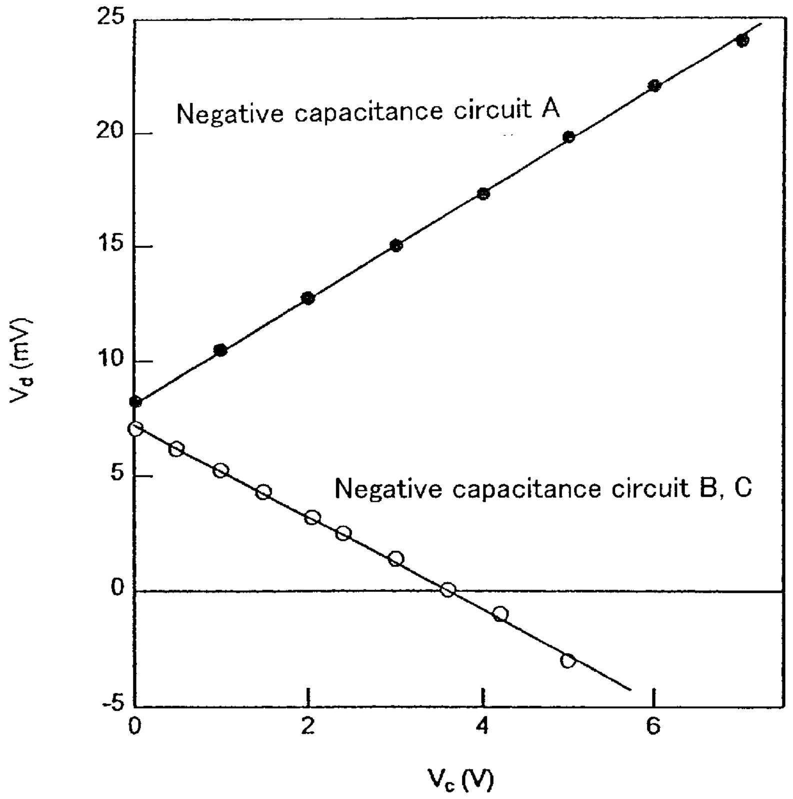
FIG. 3 is a view showing a measurement result (the relationship between an amplitude $V_c$ of a control voltage and an amplitude $V_d$ of a voltage corresponding to displacement) in the first embodiment of the invention.
Figure 4:
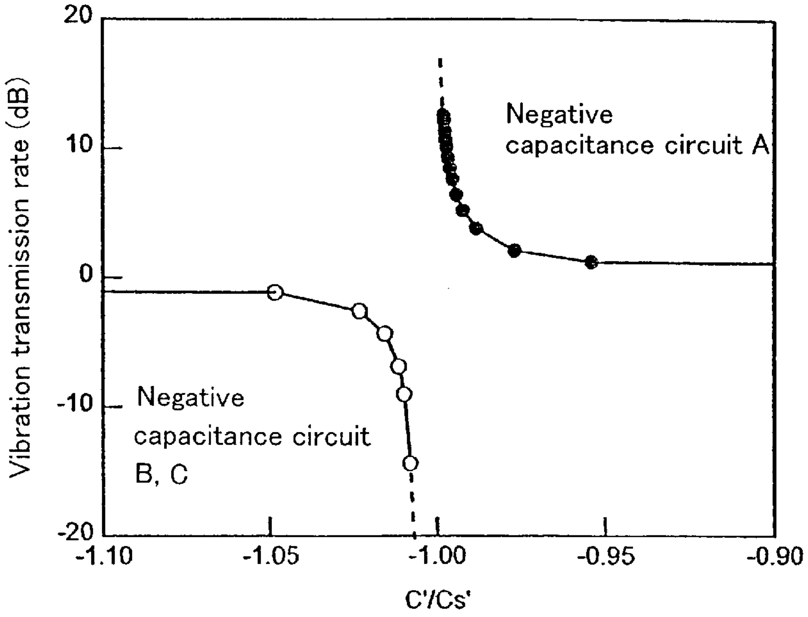
FIG. 4 is a view showing a measurement result (the relationship between C'/Cs' and a vibration transmission rate) in the first embodiment of the invention.
Figure 5:
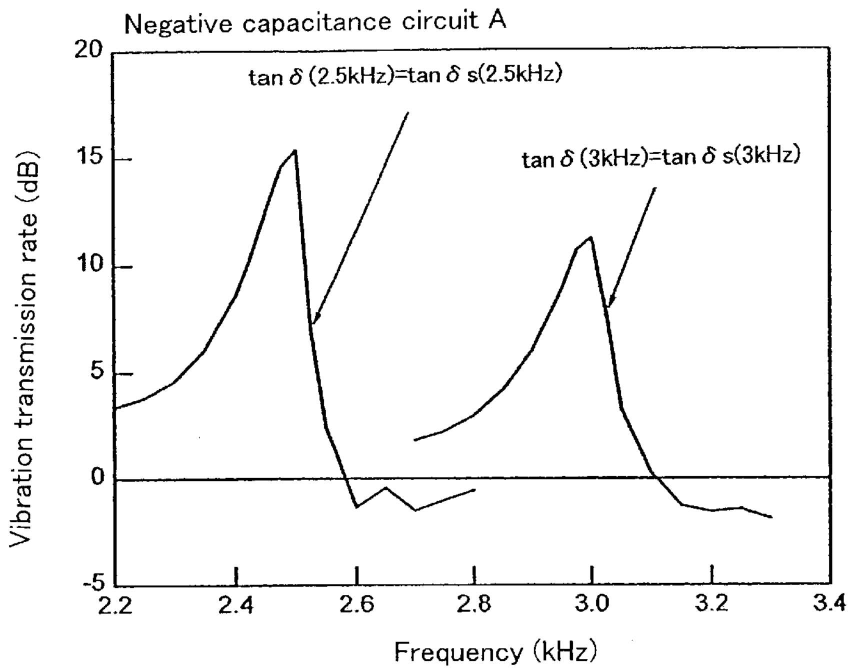
FIGS. 5(*a*) and 5(*b*) are graphs showing measurement results in the first embodiment of the invention, in which FIG. 5(*a*) shows frequency characteristics of the vibration transmission rate by the negative capacitance circuit A, and FIG. 5(*b*) shows frequency characteristics of the vibration transmission rate by the negative capacitance circuits B and C.
Figure 5:
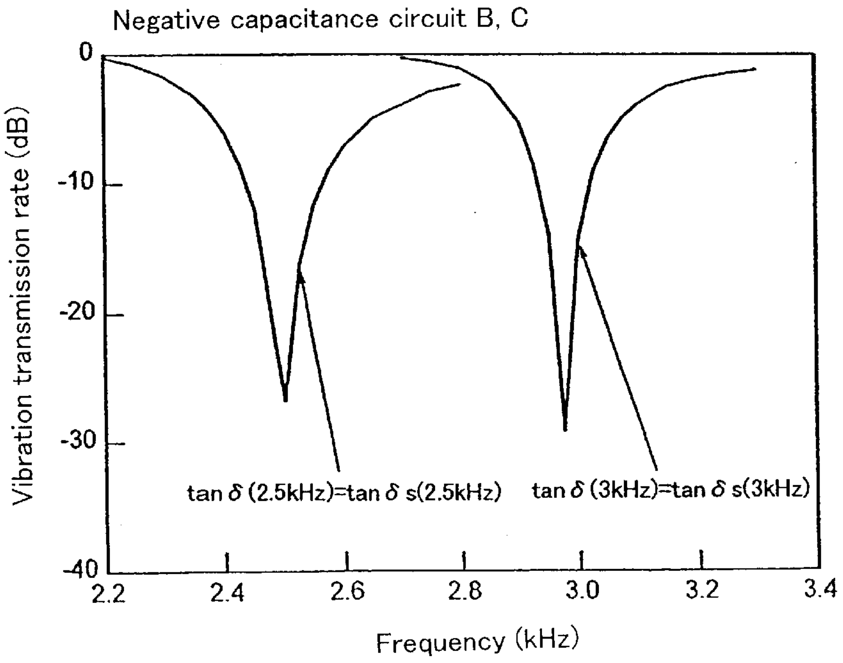
Figure 6:
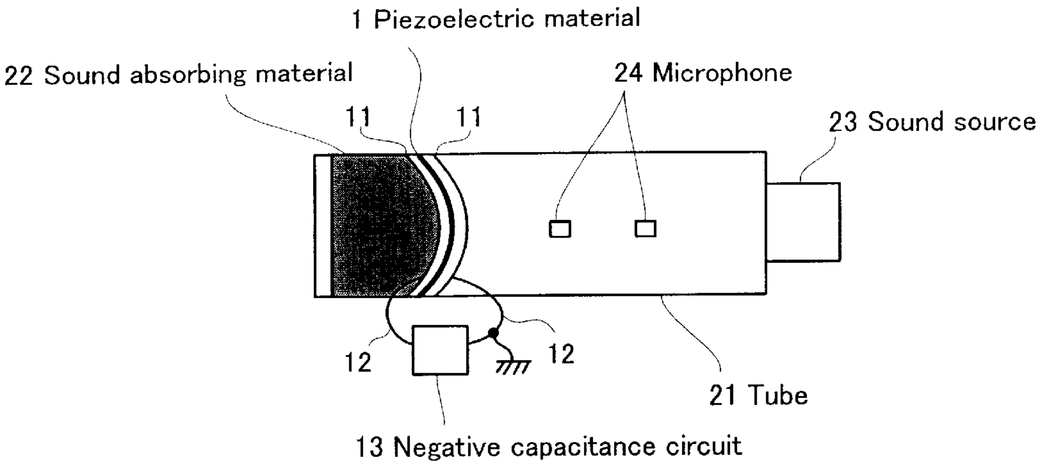
FIG. 6 is a view explaining a method of measuring acoustical characteristics in the first embodiment of the invention.
Figure 8:
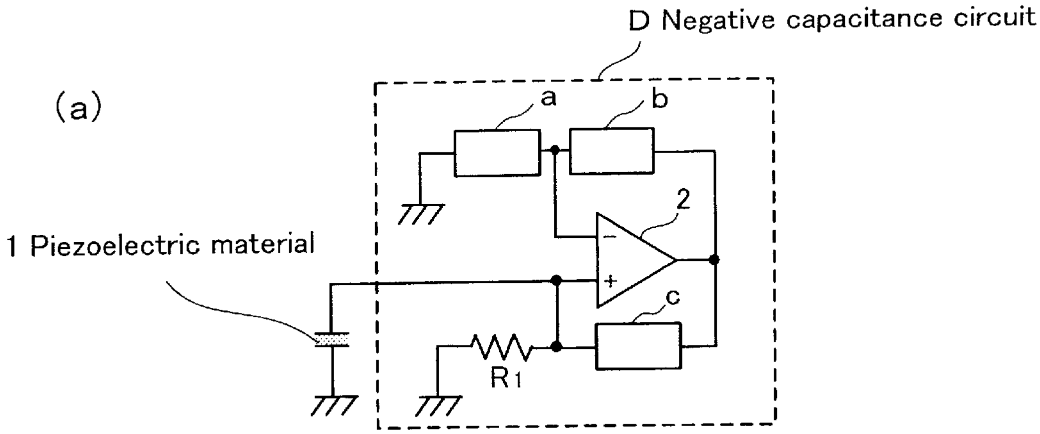
FIGS. 8(*a*) and 8(*b*) are schematic diagrams of a second embodiment of the present invention, in which FIG. 8(*a*) is a schematic diagram of an elastic wave control element using a negative capacitance circuit D, and FIG. 8(*b*) is a schematic diagram of the elastic wave control element using a negative capacitance circuit E.
Figure 8:
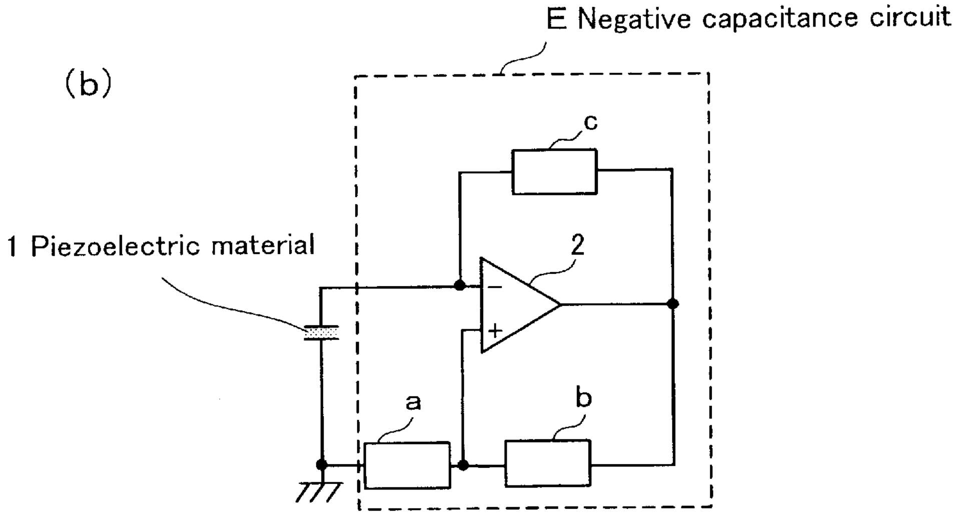
Figure 9:
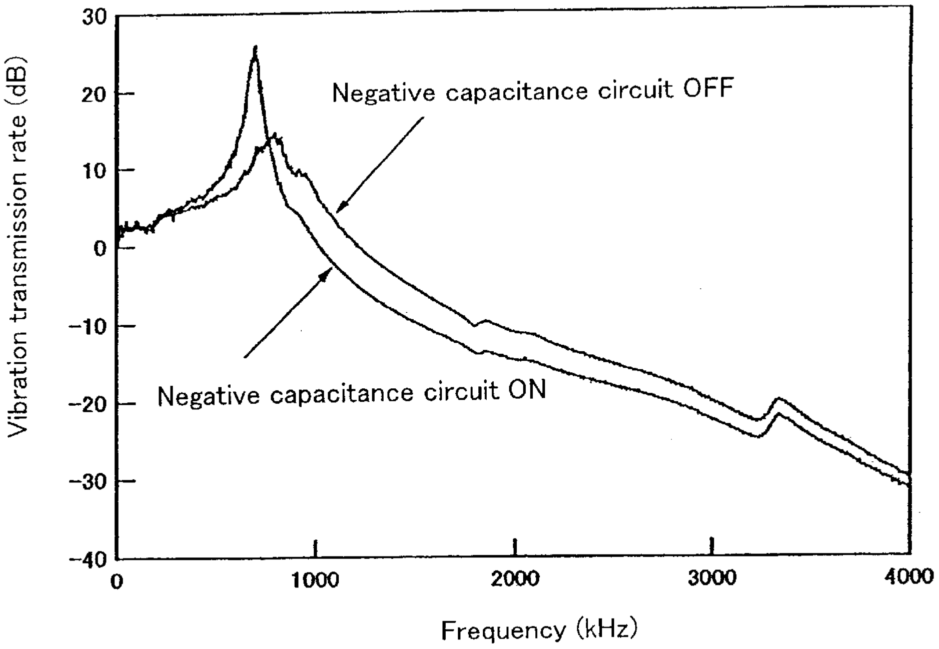
FIG. 9 is a graph showing a measurement result of vibration characteristics in the second embodiment of the invention.
Figure 10:
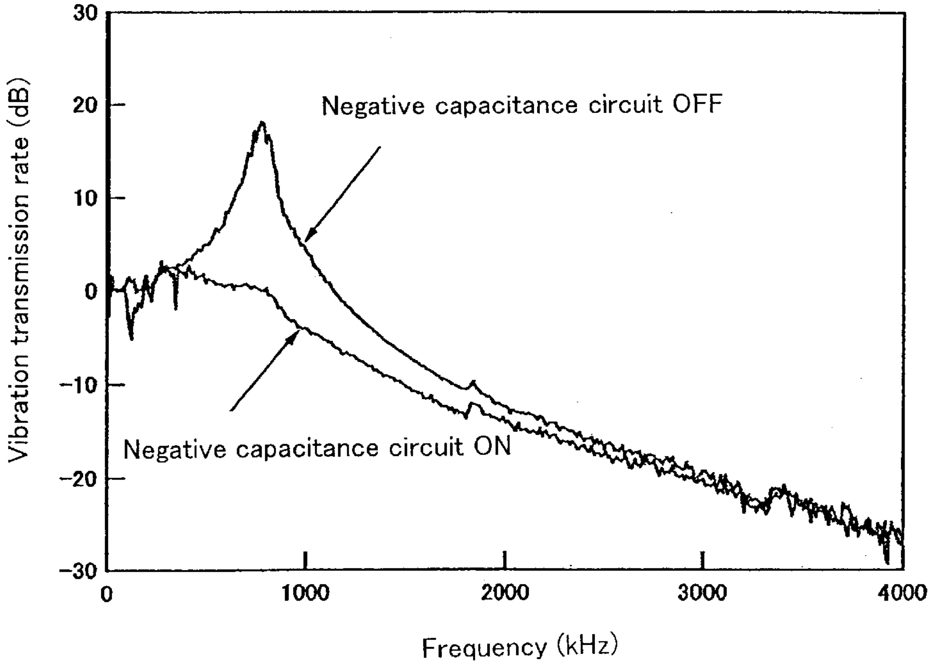
FIG. 10 is also a graph showing a measurement result of vibration characteristics in the second embodiment of the invention.
Figure 11:
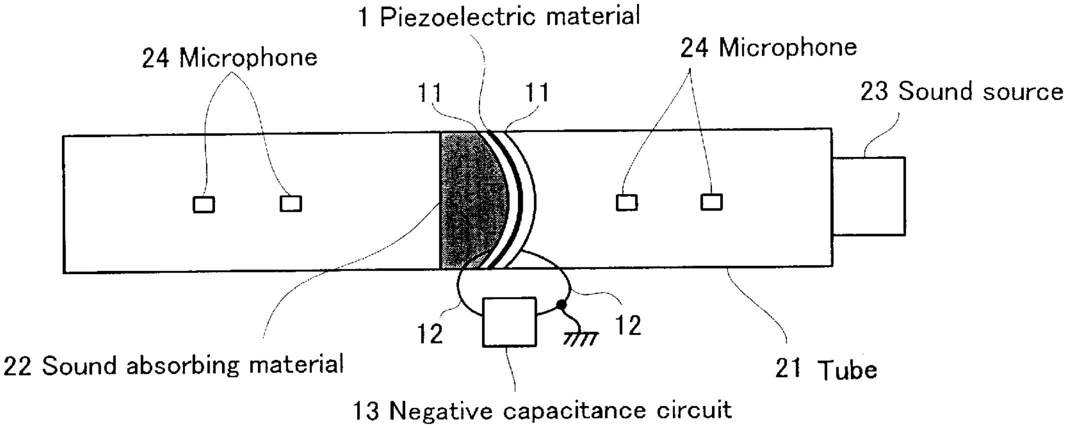
FIG. 11 is a diagram explaining a method of measuring a sound transmission loss in the second embodiment of the invention.
Figure 12:
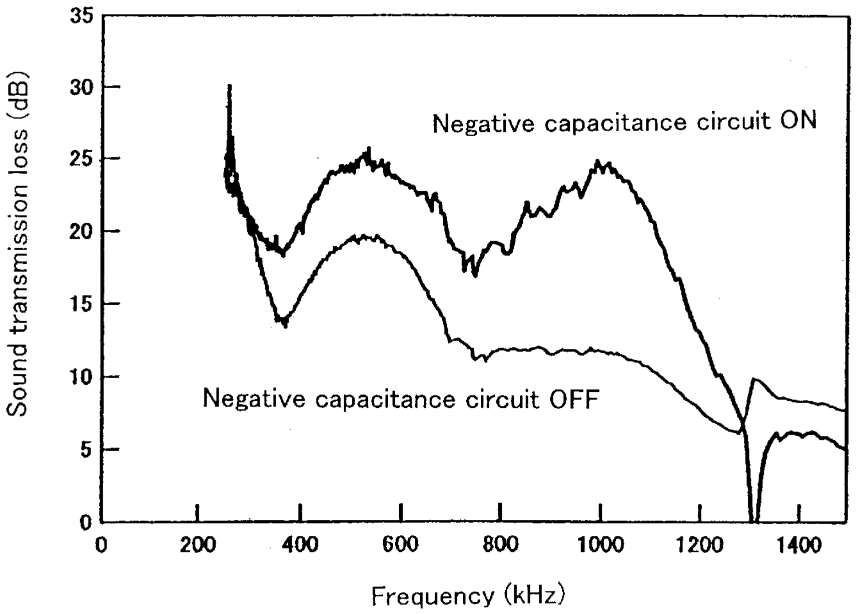
FIG. 12 is a graph showing a measurement result of the transmission loss in the second embodiment of the invention.
Figure 13:
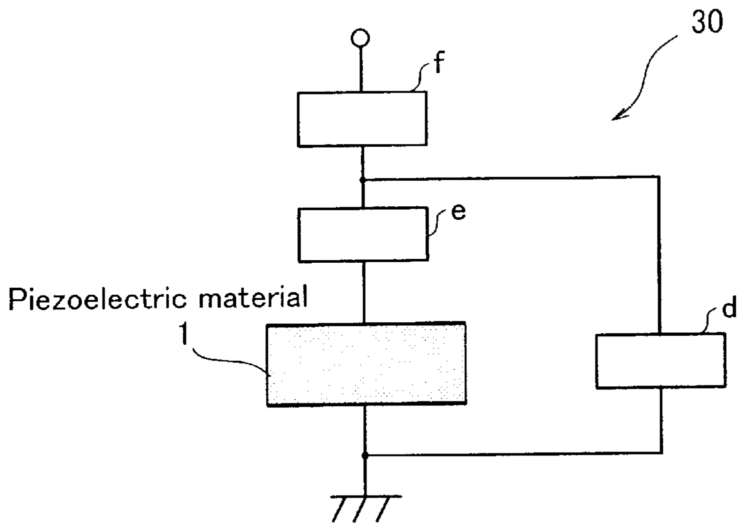
FIG. 13 is a schematic diagram of combined elements consisting of a piezoelectric material and three elements according to the invention.

Preferred embodiments of the present invention will now be described with reference the accompanying drawings. FIGS. 1(*a*)–1(*c*) are schematic diagrams of a first embodiment according to the present invention and FIG. 2 is a view explaining a method of measuring vibration characteristics in the first embodiment of the invention. FIGS. 3 through 5(*b*) are graphs showing measurement results in the first embodiment of the invention. FIG. 6 is a view explaining a method of measuring acoustical characteristics in the first embodiment of the invention and FIGS. 7(*a*) and 7(*b*) are graphs showing measurement results in the first embodiment of the invention. FIGS. 8(*a*) and 8(*b*) are schematic diagrams of a second embodiment according to the present invention. FIGS. 9 and 10 are graphs showing measurement results of vibration characteristics in the second embodiment of the present invention. FIG. 11 is a view explaining a method of measuring a sound transmission loss in the second embodiment of the present invention and FIG. 12 is a graph showing a measurement result of the transmission loss in the second embodiment of the present invention. FIG. 13 is a schematic diagram of combined elements consisting of a piezoelectric material and three elements according to the invention.

The elastic constant and elastic loss of a piezoelectric material vary with the magnitude of an anti-electric field which is caused in the inside of the piezoelectric material. Accordingly, by connecting an additional circuit which presents inductance and negative capacitance to the piezoelectric material and changing the anti-electric field artificially, it is possible to change the elastic constant (real part of complex elastic constant and imaginary part thereof) and elastic loss of the piezoelectric material remarkably (See Japanese Unexamined Patent Publication No. Hei 10-74990). According to this, the elastic compliance s(α) (a reciprocal of the elastic constant) of the piezoelectric material to which the additional circuit is connected is expressed by the following formula (1):

$$s(\alpha)=s^E\{1-k^2/(1+\alpha)\} \quad (1)$$

where $s^E$ is the elastic compliance when the voltage is constant, and k is an electromechanical coupling factor of the piezoelectric material which is a constant of from 0.1 to 0.6.

α is a value obtained by normalizing capacitance C of the additional circuit by capacitance Cs of the piezoelectric material and it is given by the following formula (2):

$$\alpha=C/Cs \quad (2)$$

Using the formula (1), the elastic compliance $s^E$ is given by the following formulas (3), (4), (5), and (6) according to the value of α:

$$s(0)=s^E(1-k^2) \quad (3)$$

$$s(\infty)=s^E \quad (4)$$

$$s(-1)=\infty \quad (5)$$

$$s(-(1-k^2))=0 \quad (6)$$

If the capacitance C of the additional circuit is positive, i.e. α is in a range of $0<\alpha<\infty$, s(α) changes only till $(1-k^2)$ times as many as $s^E$.If the range of change of α is extended until a negative value is obtained, it is possible to change s(α) from 0 to an infinite value. Then, if α is in a range of $-1<\alpha<-(1-k^2)$, s(α) is a negative value.

In this manner, by changing the electrical characteristics of the additional circuit, when a static stress is applied, it is possible to change the apparent elastic constant of the piezoelectric material remarkably.

It is intended in the present invention that, when a dynamic stress by elastic waves such as sound or vibration is applied to the piezoelectric material, the apparent elastic constant can be changed remarkably, and the elastic waves such as sound or vibration can be damped, reflected or transmitted.

The first embodiment of the invention involves an elastic wave control element using the piezoelectric material according to the present invention as shown in FIGS. 1(*a*)–1(*c*) in which surfaces of the piezoelectric material 1 are provided with a pair of electrodes. A negative capacitance circuit A, a negative capacitance circuit B, or a negative capacitance circuit C is connected to at least one of the electrodes.

When an absolute value of the capacitance C of the negative capacitance circuit A, B, or C is less than the capacitance Cs of the piezoelectric material 1 (i.e. |C|<Cs), the elastic wave control element shown in FIG. 1(*a*) is used. On the contrary, when the absolute value of the capacitance C is greater than the capacitance Cs of the piezoelectric material 1 (i.e. |C|>Cs), the elastic wave control elements shown in FIGS. 1(*b*) and (*c*) are used.

In the elastic wave control element shown in FIG. 1(*a*), the piezoelectric material 1 is inserted into a propagation path for the elastic wave or installed in an oscillator. The negative capacitance circuit A is provided with an element a and an element b which are composed of a resistor, or all of the resistor, a condenser, and a coil or a combination of any of these, and an operational amplifier 2 (of which the power source is not shown) to which a condenser Co, in which a variable resistor Ro is connected in series, is connected to form a positive feedback loop. An inverting terminal of the operational amplifier 2 is connected to the element a and the element b, while a non-inverting terminal of the operational amplifier 2 is connected to a resistor R1.

In the elastic wave control element shown in FIG. 1(*b*), the piezoelectric material 1 is also inserted into a propagation path for the elastic waves or installed in an oscillator. The negative capacitance circuit B is provided with an element a and an element b which are composed of a resistor or all of the resistor, a condenser, and a coil or a combination of any of these and an operational amplifier 2 (of which the power source is not shown) to which a condenser Co, in which a variable resistor Ro is connected in parallel, is connected to form a negative feedback loop. A non-inverting terminal of the operational amplifier 2 is connected to the element a and the element b.

In the elastic wave control element shown in FIG. 1(*c*), the piezoelectric material 1 is again inserted in to a propagation path for the elastic waves or installed in an oscillator. The negative capacitance circuit C is provided with an element a and an element b which are composed of a resistor, or all of the resistor, a condenser and a coil or a combination of any of them, a variable resistor 4 consisting of a resistor $R_1$ and a resistor $R_2$, a condenser $C_1$ connected to the variable resistor 4 in series, and an operational amplifier 2 (of which the power source is not shown) to which a condenser Co, in which a resistor R'o is connected in parallel through the resistor $R_2$, is connected to form a negative feedback loop. A non-inverting terminal of the operational amplifier 2 is connected to the element a and the element b.

Complex capacitance $C_A$* of the negative capacitance circuit A is given by the following formula (7):

$$C_A^*=C_A'-iC_A''=-(Z_2/Z_1)\cdot(1/Co^2+\omega^2Ro^2)\cdot(1/Co-i\omega Ro) \quad (7)$$

where $C_A'$ is a real part of the complex capacitance $C_A^*$, $C_A''$ is an imaginary part, ω is an angular frequency, $Z_1$ is the impedance of the element a, and $Z_2$ is the impedance of the element b.

Further, the complex capacitance $C_B^*$ of the negative capacitance circuit B and the negative capacitance circuit C is given by the following formula (8):

$$C_B^*=C_B'-iC_B''=-(Z_2/Z_1)\cdot(Co-i(1/\omega Ro)) \quad (8)$$

where $C_B'$ is a real part of complex capacitance $C_B^*$, and $C_B''$ is an imaginary part.

In the negative capacitance circuit C, the resistor Ro in the formula (8) corresponds to the ratio of $R_1$ to $R_2$, minimizes R'o, and is variable until an open condition. If the element a and the element b are variable resistors consisting of the resistors $R_a$ and $R_b$, the real part and imaginary part of the complex capacitance of the negative capacitance circuits A, B, and C can be changed by adjusting the variable resistor.

Further, by allowing the resistor Ro to be variable, it is possible to change frequency characteristics of loss factors tan δ (i.e. the ratio of the imaginary parts $C_A''$ and $C_B''$ of the complex capacitance $C_A^*$ and $C_B^*$ to the real parts $C_A'$ and $C_B'$) of the negative capacitance circuits A, B, and C. Still further, by allowing the element a and the element b, or either of them to form a network which combines all of a resistor, a condenser and a coil or any of them, it is possible to change the frequency characteristics of the capacitance and the loss factor of the negative capacitance circuits A, B, and C.

In the elastic wave control element according to the present invention, the piezoelectric material 1 produces a dynamical stress when the elastic waves such as sound or vibration are propagated through it. Accordingly, the capacitance C of the negative capacitance circuits A, B, and C connected between the electrodes of the piezoelectric material 1 and the capacitance of the piezoelectric material 1 are treated by a complex number. The complex capacitance C* of the negative capacitance circuits A, B, and C and the complex capacitance Cs* of the piezoelectric material 1 are expressed by the following formulas (9) and (10):

$$C^*=C'-i\,C''=C'(1-i\tan\delta) \qquad (9)$$

$$Cs^*=Cs'-i\,Cs''=Cs'(1-i\tan\delta s) \qquad (10)$$

where C' is the real part of the complex capacitance C* of the negative capacitance circuits A, B, and C, C" is the imaginary part of the complex capacitance C* of the negative capacitance circuits A, B, and C, tan δ is a loss factor of the negative capacitance circuits A, B, and C, Cs' is the real part of the complex capacitance Cs* of the piezoelectric material 1, Cs" is the imaginary part of the complex capacitance Cs* of the piezoelectric material 1, and tan δs is a dielectric loss factor of the piezoelectric material 1.

Using the formulas (9) and (10), α is the complex number as expressed by the following formula (11):

$$\alpha^*=\alpha'-i\alpha''=C^*/Cs^*=C'/Cs'\cdot(1-i\tan\delta)/(1-i\tan\delta s) \qquad (11)$$

Substituting the formula (11) for the formula (1), the complex elastic compliance s* can be obtained by the following formula (12) provided the elastic compliance in a condition where the voltage is constant is the complex number $s^{E*}$:

$$s^*=s'-is''=s^{E*}(1-k^2/(1+\alpha^*))=s^{E*}[1-k^2\{(1+\alpha')+i\alpha''\}/\{(1+\alpha')^2+\alpha''^2\}] \qquad (12)$$

where the real part s' of the elastic compliance corresponds to a reciprocal number of the elastic constant, and the imaginary part s" corresponds to a reciprocal number of the elastic loss. Namely, by changing the real part C' and the imaginary part C" of the complex capacitance C* of the negative capacitance circuits A, B and C and changing α' and α", it is possible to change the elastic constant and elastic loss of the piezoelectric material 1 remarkably.

In the negative capacitance circuits A, B, and C, the real part C', the imaginary part C" and the loss factor tan δ of the complex capacitance C* depend on the condenser Co, the resistor Ro and the angular frequency ω from the formulas (7) and (8). However, in the piezoelectric material 1, the real part Cs', the imaginary part Cs" and the dielectric loss factor tan δs of the complex capacitance Cs* gradually change, relative to the frequency.

Using the formula (11), in the frequency satisfying tan δ=tan δs, α* can be defined by the following formula (13):

$$\alpha^*=C'/Cs'=\alpha' \qquad (13)$$

In this case, a change of the complex elastic compliance s* is the same as that in the formulas (3) to (6) by the value of α'. Namely, in the frequency which satisfies tan δ=tan δs, it is possible to change the elastic constant and elastic loss of the piezoelectric material 1 remarkably from infinity (∞) to a negative elastic area according to the value of C'/Cs'.

As described above, in the first embodiment of the invention, by changing a capacitance component (the real part C' of the complex capacitance C*) and a resistor component (the imaginary part C" of the complex capacitance C*) of the negative capacitance circuits A, B, and C, it is possible to change the elastic constant and elastic loss of the piezoelectric material 1 in a selected frequency. In particular, in the frequency in which tan δ=tan δs, it is possible to change the elastic constant and elastic loss of the piezoelectric material 1 from infinity (∞) to the negative elastic area according to the value of C'/Cs'.

A method of measuring vibration characteristics in the first embodiment of the invention will now be described with reference to FIG. 2. Piezoelectric ceramics (PZT) are used here for the piezoelectric material 1 forming the elastic wave control element. Surfaces of the piezoelectric material 1 are provided with a pair of electrodes 11 and 11. A negative capacitance circuit 13 is connected between the electrodes 11 and 11 by an electric wire 12.

The piezoelectric material 1 is fixedly secured to an oscillator base 14, and a mass 15 is mounted on the piezoelectric material 1. The oscillator base 14 can be excited by an oscillator 16 to change the frequency and amplitude selectively. In this measurement, the amplitude is constant here. An accelerometer 17 is fixedly secured on the oscillator base 14 and the mass 15 to measure displacement on the upper surface of the oscillator base 14 and the mass 15.

The displacement on the upper surface of mass 15 was measured by the accelerometer 17 by changing a real part of the complex capacitance of the negative capacitance circuit and by changing the control voltage applied to the piezoelectric material 1 from the negative capacitance circuit 13. By allowing a loss factor of the negative capacitance circuit 13 to be matched with a dielectric loss factor of the piezoelectric material 1 at 3 kHz, a frequency of applied vibration was 3 kHz.

FIG. 3 shows the amplitude $V_d$ of a voltage which is proportional to the displacement measured by the accelerometer 17 relative to the amplitude $V_c$ of a control voltage of the negative capacitance circuit 13. Filled circles show a measurement result in the negative capacitance circuit A, while open circles show a measurement result in the negative capacitance circuit B and C. The amplitude $V_d$ of the voltage is proportional to the amplitude $V_c$ of the control voltage in each of the negative capacitance circuit A, the negative capacitance circuit B, and the negative capacitance circuit C.

When the negative capacitance circuit A is added, the amplitude $V_d$ of voltage increases as the amplitude $V_c$ of the control voltage increases. This means that, when the negative capacitance circuit A is added to the piezoelectric material 1, the elastic constant increases as the amplitude $V_c$ of the control voltage increases. On the other hand, when the negative capacitance circuit B or the negative capacitance circuit C is added, the amplitude $V_d$ of the voltage decreases as the amplitude $V_c$ of control voltage increases. In particular, when $V_c$=3.5V, $V_d$=0 mV. This means that vibration damping has been fully attained.

Further, when $V_c$ is more than 3.5 V, $V_d$ is minus. These results show that, when the negative capacitance circuit B or the negative capacitance circuit C is added to the piezoelectric material 1, the elastic constant decreases as $V_c$ increases and in particular, when $V_c$=3.5 V, the elastic constant is 0, and when $V_c$>3.5 V, it is in the negative elastic area.

Capacitance dependence of the vibration transmission coefficient on the negative capacitance circuit 13 was measured. By allowing the loss factor of the negative capacitance circuit 13 to be matched with the dielectric loss factor of the piezoelectric material 1 at 3 kHz, the vibration transmission coefficient was measured at 3 kHz.

FIG. 4 shows vibration transmission coefficient relative to the ratio C'/Cs' of capacitance C' of the negative capacitance circuit 13 to the capacitance Cs' of the piezoelectric material 1. Filled circles show a measurement result in the case where the negative capacitance circuit A is connected to the piezoelectric material 1 and open circles show a measurement result in the case where the negative capacitance circuit B or the negative capacitance circuit C is connected to the piezoelectric circuit 1. When the negative capacitance circuit A is connected, the vibration transmission rate increases as the ratio of C'/Cs' decreases, while, when the negative capacitance circuit B or the negative capacitance circuit C is connected, the vibration transmission rate decreases as the ratio of C'/Cs' increases. In each case, a remarkable change was found near C'/Cs'=−1.

This result shows that the elastic wave control element according to the present invention can increase/decrease the vibration transmission rate by changing each capacity ratio of the negative capacitance circuit 13 to the piezoelectric material 1, i.e. by changing the electrical characteristics of the negative capacitance circuit 13. In other words, the result shows that the elastic wave control element cannot only damp the vibration, but also can transmit the vibration remarkably.

Next, by allowing the dielectric loss factor of the negative capacitance circuit 13 to be matched with that of the piezoelectric material 1 at 2.5 kHz or 3 kHz, frequency characteristics of each vibration transmission rate were measured.

FIG. 5(*a*) shows a measurement result in the case where the negative capacitance circuit A is connected to the piezoelectric material 1. FIG. 5(*b*) shows a measurement result in the case where the negative capacitance circuit B or the negative capacitance circuit C is connected to the piezoelectric material 1. When the negative capacitance circuit A is connected to the piezoelectric material 1, the vibration transmission rate increases. However, when the negative capacitance circuit B or the negative capacitance circuit C is connected to the piezoelectric material 1, the vibration transmission rate decreases. These results agree with FIG. 4. In each case, the vibration transmission coefficient depends on the frequency, wherein the vibration transmission rate shows an upward peak in FIG. 5(*a*) and shows a downward peak in FIG. 5(*b*), at the frequency where each loss factor is matched. At that time, the vibration transmission coefficient reached 15 dB in FIG. 5(*a*) and −30 dB in FIG. 5(*b*), respectively.

As described above, the elastic wave control element according to the present invention can not only damp the elastic wave in a specified frequency, but also can transmit it remarkably. The elastic wave control element can also change the frequency and the vibration transmission rate electrically.

FIG. 6 shows a measurement method for acoustic characteristics. A polyvinylidene fluoride (PVDF) film is used here for the piezoelectric material 1. In the same manner as the measurement of vibration characteristics described above, a pair of electrodes is provided on the surfaces of piezoelectric material 1, and a negative capacitance circuit 13 is connected between the electrodes 11 and 11 using an electric wire 12.

The piezoelectric material 1 is curvedly inserted into a cylindrical sounding tube 21 with a diameter of 5 cm. Provided on the back of the piezoelectric material 1 is a sound absorbing material 22. A sound source 23 is also provided at an opening of the sounding tube 21. Two microphones 24 are provided in the sounding tube 21 to measure frequency characteristics of a sound absorbing coefficient. The sound absorbing coefficient in the case where the negative capacitance circuit 13 is not provided was also measured.

Figure 7:
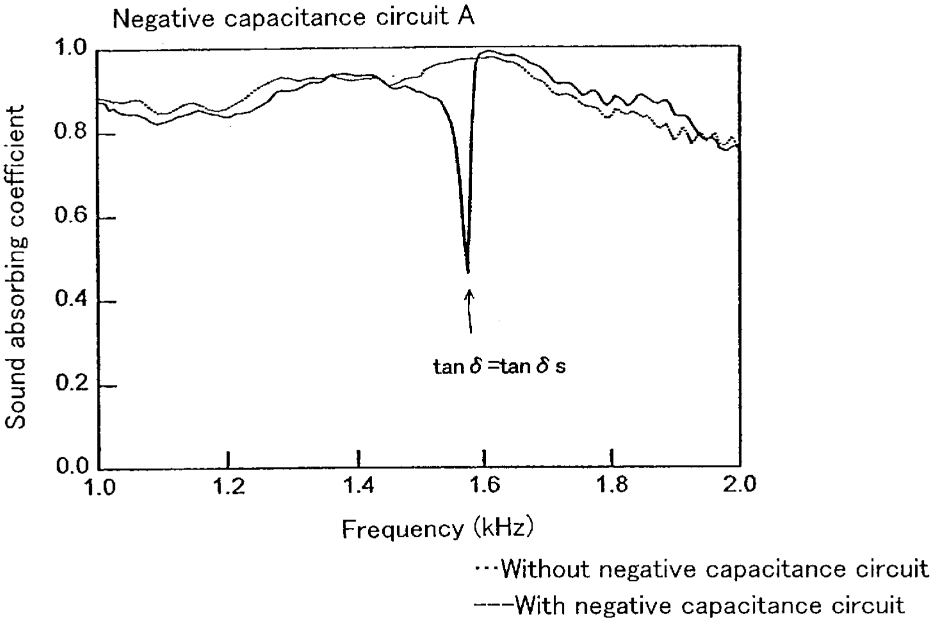
FIGS. 7(*a*) and 7(*b*) are graphs showing measurement results in the first embodiment of the invention, in which FIG. 7(*a*) shows frequency characteristics of a sound absorption coefficient by the negative capacitance circuit A, and FIG. 7(*b*) shows frequency characteristics of a sound absorption coefficient by the negative capacitance circuits B and C.
Figure 7:
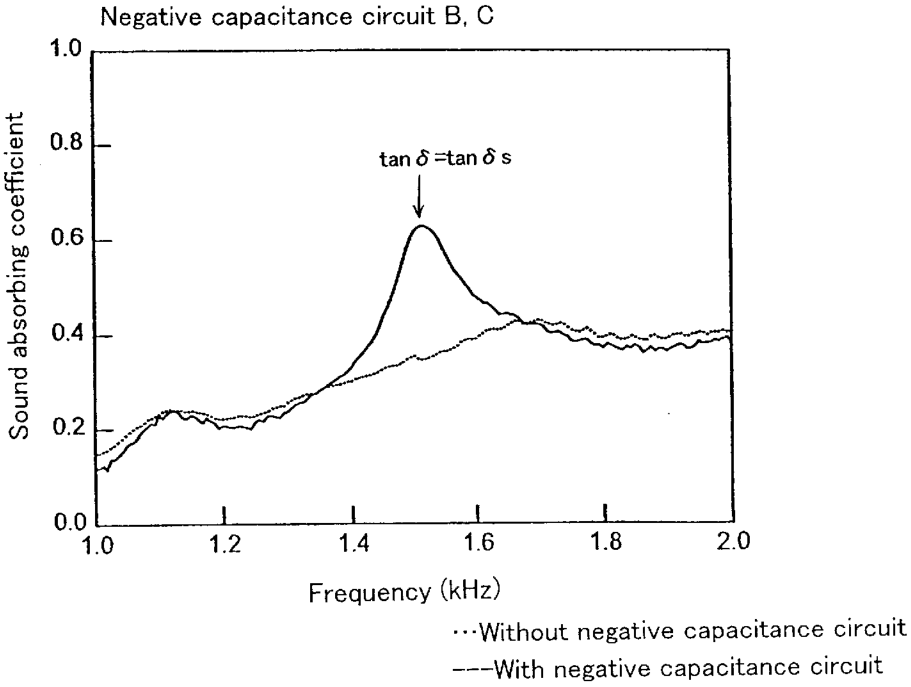

In FIG. 7(*a*), frequency characteristics of the sound absorbing coefficient in the case where the negative capacitance circuit A is connected to the piezoelectric material 1 are shown in a solid line. In FIG. 7(*b*), the sound absorbing coefficient in the case where the negative capacitance circuit B or the negative capacitance circuit C is connected to the piezoelectric material 1 is shown in a solid line. In FIGS. 7(*a*) and (*b*), the sound absorbing coefficient without provision of the negative capacitance circuit 13 is also shown in a dotted line. The dielectric loss factors of the negative capacitance circuit 13 and the piezoelectric material 1 are matched near 1.6 kHz.

From FIG. 7(*a*), when the negative capacitance circuit A is connected to the piezoelectric material 1, the sound absorbing coefficient shows a downward peak near 1.6 kHz, wherein the magnitude of the peak is 6.5 dB. This result shows that, when the negative capacitance circuit A is connected to the piezoelectric material 1 and each dielectric loss factor is matched in a selective frequency, sound reflection is carried out selectively in that frequency.

From FIG. 7(*b*), when the negative capacitance circuit B or the negative capacitance circuit C is connected to the piezoelectric material 1, the sound absorbing coefficient shows an upward peak near 1.6 kHz, wherein the magnitude of the peak is 5.4 dB. This result shows that, when the negative capacitance circuit B is connected to the piezoelectric material 1 and each dielectric loss factor is matched in a selective frequency, sound absorption is carried out selectively in such a frequency.

A second embodiment of the elastic wave control element using the piezoelectric material according to the present invention is shown in FIGS. 8(*a*) and 8(*b*). A pair of electrodes is provided on the surfaces of the piezoelectric material 1, and a negative capacitance circuit D or a negative capacitance circuit E is connected to at least one electrode. The piezoelectric material 1 is inserted into a propagation path for the elastic wave, or installed in an oscillator.

The elastic wave control element shown in FIG. 8(*a*) is used when an absolute value |C| of the capacitance C of the negative capacitance circuit D is less than the capacitance Cs of the piezoelectric material 1 (i.e. |C|<Cs). On the other hand, the elastic wave control element shown in FIG. 8(*b*) is used when an absolute value |C| of the capacitance C of the negative capacitance circuit E is greater than the capacitance Cs of the piezoelectric material 1 (i.e. |C|>Cs).

In the elastic wave control element shown in FIG. 8(*a*), the negative capacitance circuit D is provided with an elements a and an element b which are composed of a resistor or all of the resistor, a condenser, and a coil or a combination of any of them, and an operational amplifier 2 (of which the power source is not shown) to which an element c is connected to form a positive feedback loop. The element a and the element b are connected to an inverting terminal of the operational amplifier 2. A grounded resistor is connected to a non-inverting terminal of the operational amplifier 2.

In the elastic wave control element shown in FIG. 8(*b*), the negative capacitance circuit E is provided with an element a and element b which are composed of a resistor or all of the resistor, a condenser, and a coil, or a combination of any of them, and an operational amplifier 2 (of which the power source is not shown) to which an element c is connected to form a negative feedback loop. The element a and the element b are connected to a non-inverting terminal of the operational amplifier 2.

The element c of the negative capacitance circuits D and E forms a network, composed of all of a resistor, a condenser, and a coil or a combination of any of them, which is arranged to allow frequency characteristics of a loss factor of the negative capacitance circuits D and E to be matched with the frequency characteristics of a dielectric loss factor of the piezoelectric material 1 in a selected frequency band.

If a part of an element forming the element c is made of the same material as the piezoelectric material 1, it is possible to change the frequency band selectively which allows the frequency characteristics of the loss factor of the negative capacitance circuits D and E to be easily matched with the frequency characteristics of the dielectric loss factor of the piezoelectric material 1 in a selected frequency band.

Further, if the element c is made of the same material as the piezoelectric material 1, it is possible to allow the temperature characteristics of the loss factor to be matched with those of the piezoelectric material 1.

Accordingly, in the second embodiment of the invention, the elastic wave control element according to the present invention can change the elastic constant and the elastic loss remarkably in a selected frequency band. The elastic wave control element can allow the elastic wave in such a frequency band to be damped, reflected or transmitted selectively and also compensate for the temperature characteristics.

The complex capacitance C* of the negative capacitance circuit D and the negative capacitance circuit E is given by the following formula (14):

$$C^*=C'-iC''=-(Z_2/Z_1)\cdot(C_1'-i\ C_1'')=-(Z_2/Z_1)\cdot C_1'(1-i\tan\delta_1) \quad (14)$$

where C' is a real part of the complex capacitance C* of the negative capacitance circuit D and the negative capacitance circuit E, C" is an imaginary part of the complex capacitance C* of the negative capacitance circuit D and the negative capacitance circuit E, $C_1'$ is a real part of the complex capacitance of the element c, $C_1''$ is an imaginary part of the complex capacitance of the element c, $Z_1$ is an impedance of the element a, and $Z_2$ is an impedance of the element b. tan $\delta_1$ is a loss factor of the element c and $\tan\delta_1=C_1''/C_1'$.

If the element a and the element b are variable resistors which is comprised of a resistor $R_1$ and $R_2$, the complex capacitance C* of the negative capacitance circuit D and the negative capacitance circuit E is a real number times as many as the complex capacitance of the element c.

From the formula (14), tan $\delta_1$ is a loss factor of the negative capacitance circuit D and the negative capacitance circuit E. However, if the element a and the element b or any of them form a network which is composed of all of the resistor, the condenser, and the coil or any of them, it is possible to change the frequency characteristics of the capacitance and loss factor of the negative capacitance circuit D and the negative capacitance circuit E.

In the same manner as in the formula (11), the ratio of the complex capacitance C* of the negative capacitance circuit to the complex capacitance Cs* of the piezoelectric material 1 is$\alpha^*$, $\alpha^*$ is expressed by the following formula (15):

$$\alpha^*=C^*/Cs^*=(C'-i\ C'')/(Cs'-i\ Cs'')=(C'/Cs')\cdot(1-i\tan\delta)/(1-i\tan\delta s) \quad (15)$$

If the frequency characteristics and temperature characteristics of an absolute value of the real part C' of the complex capacitance and the loss factor tan δ of the negative capacitance circuit are matched with the frequency characteristics and temperature characteristics of the capacitance Cs' and dielectric loss factor tan δs of the piezoelectric material 1 in a selected frequency band and temperature range, it is possible that C'=X Cs' and tan δ=Y tan δs in such an area. X and Y are real numbers here and if they are substituted in the above formula (15), α is given by a function of X and Y as shown in the following formula (16):

$$\alpha^*=\alpha'-i\alpha''=X\{(1+Y\tan^2\delta s)/(1+\tan\delta s)\}-iX(Y-1)\tan\delta s \quad (16)$$

If the formula (16) is substituted in the formula (12), by changing the real number X and the real number Y, it can be recognized that the elastic constant and elastic loss of the piezoelectric material 1 change.

Further, when Y=1 ($\tan\delta_1=\tan\delta s$), $\alpha^*=\alpha'=C'/Cs'$. In this case, in the same manner as the formulas (3) to (6), a complex elastic compliance s * of the piezoelectric material 1 can be changed remarkably from ∞ to the negative elastic area according to a value of C'/Cs'. If the frequency characteristics and temperature characteristics of the real part C' of the complex capacitance of the negative capacitance circuit D and the negative capacitance circuit E are matched with those of the piezoelectric material 1 in a selected frequency band and temperature range, the value of C'/Cs' is constant in such an area. As a result, the elastic constant and elastic loss of the piezoelectric material 1 can be changed remarkably over that area.

As described above, according to the second embodiment of the invention, by allowing the loss factor of the negative capacitance circuits D and E which are added to the piezoelectric material 1 to be matched with a dielectric loss factor of the piezoelectric material 1 in a selected frequency band or temperature range, it is possible to change the elastic constant and elastic loss of the piezoelectric material 1 over the selected frequency band or temperature range and to compensate for the frequency characteristics and temperature characteristics of a damping factor, reflection factor, or transmission factor (i.e. vibration transmission rate) of the elastic wave.

A measurement result of vibration damping characteristics in the second embodiment of the invention will now be shown. The measurement was conducted by a method shown in FIG. 2 in the same manner as in the first embodiment of the invention.

By the accelerometer 17 provided on the oscillator base 14 and the accelerometer 17 provided on the upper surface of the mass 15, each acceleration is measured, and the vibration transmission coefficient is obtained from a ratio of those measurements.

FIG. 9 shows frequency characteristics of the vibration transmission coefficient. A negative capacitance circuit E is added to the piezoelectric material 1. As an element c of the negative capacitance circuit E, a network consisting of a resistor and a condenser is used. The condenser is made of the same material as the piezoelectric material 1 and the resistor is set variable. When the negative capacitance circuit E is added to the piezoelectric material 1, the vibration transmission rate decreases more than 5 dB beyond a resonance frequency near 700 Hz.

Since the resonance frequency has a sharper peak on the low frequency side, it is obvious that the elastic constant and elastic loss of the piezoelectric material 1 is decreased by addition of the negative capacitance circuit E to the piezoelectric material 1. In other words, it is obvious that, by adding the negative capacitance circuit E, the elastic constant and elastic loss of the piezoelectric material 1 has been decreased over a wide frequency band including the resonance frequency, and this decreases the transmission of vibration.

Further, by changing the characteristics of the element c forming the negative capacitance circuit E, it is possible to decrease the resonance near 700 Hz as shown in FIG. 10. This means that, by changing the electrical characteristics of the element c forming the negative capacitance circuit E, the elastic loss of the piezoelectric material 1 has been increased and the resonance has been decreased in a frequency band near the resonance.

Next, a measurement result of acoustic characteristics in the second embodiment of the invention will be shown. The measurement was carried out by sound transmission loss measuring equipment using a tube shown in FIG. 11. A copolymer of vinylidene fluoride and trifluoroethylene is used for the piezoelectric material 1. In the same manner as in the embodiment of the first invention, a pair of electrodes 11, 11 is provided on the surfaces of the piezoelectric material 1 which produces a voltage and a negative capacitance circuit 13 is connected between the electrodes 11, 11 by an electric wire 12.

The piezoelectric material 1 is curvedly inserted into the cylindrical tube 21 with a diameter of 5 cm, and a sound absorbing material 22 is provided in the back of the piezoelectric material 1. A sound source 23 is provided at an opening of the sounding tube 21. Respectively provided on the front and back surfaces of a film in the sounding tube 21 are two microphones to measure frequency characteristics of the sound transmission loss. The sound transmission loss in the case where the negative capacitance circuit 13 is not provided was also measured here.

FIG. 12 shows frequency characteristics of the sound transmission loss of the film. Here is used the negative capacitance circuit D in which a network consisting of a resistor and a condenser is used for an element c and the resistor is variable. When the negative capacitance circuit D is added to the piezoelectric material 1, the sound transmission loss increases between 300 Hz and 1 kHz. This shows that an increment of sound reflection has been attained in such a frequency band.

In place of the piezoelectric material 1 shown in FIGS. 1 through 8, as shown in FIG. 13, combined elements 30 which are formed by connecting three elements d, e, and f to the piezoelectric material 1 in series or in parallel can also be connected to the negative capacitance circuits A, B, C, D, and E.

Each of three elements of d, e, and f is formed by a network which combines any of a resistor, a condenser, and a coil, or more than two of these.

Only the element d among three elements of d, e, and f can be opened, or any or both of the elements e, f may be short-circuited.

For example, if a condenser is used for the element d, it is possible to make the frequency characteristics of capacitance of the piezoelectric material 1 flatter. It is also possible to obtain the same effect as above when a coaxial cable is connected to the piezoelectric material 1.

If a resistor is used for the element e, it is possible to obtain a large electrical response decrease due to piezoelectric resonance.

Electrical characteristics of the combined elements 30 consisting of the piezoelectric material 1 connected to the negative capacitance circuits A, B, C, D, and E and three elements of d, e, and f can be treated as a combination in which the original characteristics of the piezoelectric material 1 have been combined with the impedance of the three elements d, e, and f.

As described above, according to the first aspect of the invention, a piezoelectric material is provided with a pair of electrodes between which a negative capacitance circuit is connected. By allowing a loss factor of the negative capacitance circuit to be matched with a dielectric loss factor of the piezoelectric material in a selected frequency or frequency band, the elastic wave in such a frequency or frequency band can be damped, reflected, or transmitted. It is also possible to change those characteristics electrically.

According to the second aspect of the invention, a piezoelectric material is provided with a pair of electrodes between which a negative capacitance circuit is connected. By allowing frequency characteristics and temperature characteristics of an absolute value of capacitance and a loss factor of the negative capacitance circuit to respectively be matched with frequency characteristics and temperature characteristics of capacitance and loss factor of the piezoelectric material in a selected frequency band and temperature range, an elastic wave can be damped, reflected, or transmitted uniformly in the selected frequency band and temperature range. Those characteristics can be changed electrically.

According to the third aspect of the invention, a piezoelectric material is provided with a pair of electrodes between which a negative capacitance circuit is connected. By allowing frequency characteristics of an absolute value of capacitance and a loss factor of the negative capacitance circuit to be matched with frequency characteristics of capacitance and loss factor of the piezoelectric material in a selected frequency band, an elastic wave can be damped, reflected or transmitted uniformly in a selected frequency band and those characteristics can be changed electrically.

According to the fourth aspect of the invention, a piezoelectric material is provided with a pair of electrodes between which a negative capacitance circuit is connected. By allowing temperature characteristics of an absolute value of capacitance and a loss factor of the negative capacitance circuit to be matched with temperature characteristics of capacitance and a loss factor of the piezoelectric material in a selected temperature range, an elastic wave can be damped, reflected, or transmitted uniformly in a selected temperature range, and those characteristics can be changed electrically.

According to the fifth aspect of the invention, an element, for determining a loss factor, among elements forming a negative capacitance circuit is made of the same material as a piezoelectric material which is connected outside. Accordingly, it is possible to allow frequency characteristics and temperature characteristics of an absolute value of capacitance and a loss factor of the negative capacitance circuit to be matched with frequency characteristics and temperature characteristics of capacitance and a loss factor of the piezoelectric material respectively.

According to the sixth aspect of invention, an element, for determining a loss factor, among elements forming a negative capacitance circuit, forms a network using all of a resistor, a condenser, and a coil or any of them. Accordingly, it is possible to allow frequency characteristics of an absolute value of capacitance and a loss factor of the negative capacitance circuit to be matched with frequency characteristics of capacitance and a loss factor of the piezoelectric material, respectively.

According to the seventh aspect of the invention, a part or all of elements forming the network is made of the same material as the piezoelectric material. Accordingly, it is possible to allow frequency characteristics and temperature characteristics of an absolute value of capacitance and a loss factor of the negative capacitance circuit to be easily matched with frequency characteristics and temperature characteristics of capacitance and a loss factor of the piezoelectric material.

According to the eighth aspect of the invention, a resistor among elements forming a network is variable. Accordingly, it is possible to allow frequency characteristics of capacitance and loss factor of a negative capacitance circuit to be variable to be matched with frequency characteristics of capacitance and loss factor of the piezoelectric material.

According to the ninth aspect of the invention, electrical characteristics of combined elements consisting of a piezoelectric material and three elements can be treated as a combination in which the original characteristics of the piezoelectric material are combined with impedance of three elements.

According to the tenth aspect of the invention, it is possible to make frequency characteristics of capacitance of the piezoelectric material flatter, and to make a reduction in larger electric response due to piezoelectric resonance.

Although there have been described what are the present embodiments of the invention, it will be understood by persons skilled in the art that variations and modifications may be made thereto without departing from the gist, spirit or essence of the invention. The scope of the invention is indicated by the appended claims.

What is claimed is:

1. An elastic wave control element comprising: a piezoelectric material which is inserted into a propagation path for an elastic wave or installed in an oscillator to allow the elastic wave in a selected frequency to be damped, reflected or transmitted; a pair of electrodes provided with the piezoelectric material; a negative capacitance circuit connected between the pair of electrodes; and wherein capacitance and loss factor of the negative capacitance circuit and frequency characteristics thereof are selectively variable to allow the loss factor of the negative capacitance circuit in a selected frequency or a selected frequency range to be matched with a dielectric loss factor of the piezoelectric material.

2. An elastic wave control element comprising: a piezoelectric material which is inserted into a propagation path for an elastic wave or installed in an oscillator to allow the elastic wave in a selected frequency band to be damped, reflected, or transmitted; a pair of electrodes provided with the piezoelectric material; a negative capacitance circuit connected between the pair of electrodes; and wherein capacitance and loss factor of the negative capacitance circuit and frequency characteristics and temperature characteristics thereof are selectively variable to allow frequency characteristics and temperature characteristics of an absolute value of capacitance and the loss factor of the negative capacitance circuit to be matched with frequency characteristics and temperature characteristics of capacitance and the loss factor of the piezoelectric material in a selected frequency band and temperature range.

3. An elastic wave control element comprising: a piezoelectric material which is inserted into a propagation path for an elastic wave or installed in an oscillator to allow the elastic wave in a selected frequency band to be damped, reflected, or transmitted; a pair of electrodes provided with the piezoelectric material; a negative capacitance circuit connected between the pair of electrodes; and wherein capacitance and loss factor of the negative capacitance circuit and frequency characteristics thereof are selectively variable to allow frequency characteristics of an absolute value of capacitance and the loss factor of the negative capacitance circuit to be matched with frequency characteristics of capacitance and loss factor of the piezoelectric material in a selected frequency band.

4. An elastic wave control element comprising: a piezoelectric material which is inserted into a propagation path for an elastic wave or installed in an oscillator to allow the elastic wave in a selected frequency or frequency band to be damped, reflected or transmitted; a pair of electrodes provided with the piezoelectric material; a negative capacitance circuit connected between the pair of electrodes; and wherein capacitance and loss factor of the negative capacitance circuit and temperature characteristics thereof are selectively variable to allow temperature characteristics of an absolute value of capacitance and the loss factor of the negative capacitance circuit to be matched with temperature characteristics of capacitance and a loss factor of the piezoelectric material in a selected temperature range.

5. The elastic wave control element according to claim 1, wherein an element among elements forming the negative capacitance circuit is made of the same material as the piezoelectric material.

6. The elastic wave control element according to claim 1, wherein an element among elements forming the negative capacitance circuit forms a network, and includes at least one of a resistor, a condenser, and a coil.

7. The elastic wave control element according to claim 6, wherein at least one of the elements forming the network is made of the same material as the piezoelectric material.

8. The elastic wave control element according to claim 6, wherein the network includes a variable resistor to vary frequency characteristics of capacitance and loss factor of the negative capacitance circuit.

9. The elastic wave control element according to claim 1, further comprising three combined elements connected to the piezoelectric material and to the negative capacitance circuit, and the three combined elements form a network and include at least one of a resistor, a condenser, and a coil.

10. The elastic wave control element according to claim 9, wherein one of the three combined elements is opened, or at least one of the other two combined elements is short-circuited.

11. The elastic wave control element according to claim 7, wherein the network includes a variable resistor to vary frequency characteristics of capacitance and loss factor of the negative capacitance circuit.

12. The elastic wave control element according to claim 2, wherein an element among elements forming the negative capacitance circuit is made of the same material as the piezoelectric material.

13. The elastic wave control element according to claim 2, wherein an element among elements forming the negative capacitance circuit forms a network, and includes at least one of a resistor, a condenser, and a coil.

14. The elastic wave control element according to claim 13, wherein at least one of the elements forming the network is made of the same material as the piezoelectric material.

15. The elastic wave control element according to claim 13, wherein the network includes a variable resistor to vary frequency characteristics of capacitance and loss factor of the negative capacitance circuit.

16. The elastic wave control element according to claim 2, further comprising three combined elements connected to the piezoelectric material and to the negative capacitance circuit, and the three combined elements form a network and include at least one of a resistor, a condenser, and a coil.

17. The elastic wave control element according to claim 16, wherein one of the three combined elements is opened, or at least one of the other two combined elements is short-circuited.

18. The elastic wave control element according to claim 3, wherein an element among elements forming the negative capacitance circuit is made of the same material as the piezoelectric material.

19. The elastic wave control element according to claim 1, wherein an element among elements forming the negative capacitance circuit forms a network, and includes at least one of a resistor, a condenser, and a coil.

20. The elastic wave control element according to claim 4, wherein an element among elements forming the negative capacitance circuit is made of the same material as the piezoelectric material.

* * * * *

UNITED STATES PATENT AND TRADEMARK OFFICE

CERTIFICATE OF CORRECTION

PATENT NO. : 6,548,936 B2
DATED : April 15, 2003
INVENTOR(S) : Hidekazu Kodma et al.

It is certified that error appears in the above-identified patent and that said Letters Patent is hereby corrected as shown below:

Column 3,
Line 34, change "construced" to -- constructed --.

Column 4,
Line 37, after "reference" insert -- to --.

Column 6,
Line 18, change "in to" to -- into --

Column 10,
Line 28, after "circuit B" insert -- or the negative capacitance circuit C --.
Line 50, change "elements" to -- element --

Column 11,
Line 43, change "which is comprised" to -- which are comprised --.
Line 58, change "is$\alpha$*" to -- is $\alpha$* --.

Column 14,
Line 50, before "invention" insert -- the --.

Signed and Sealed this

Twenty-third Day of September, 2003

JAMES E. ROGAN
*Director of the United States Patent and Trademark Office*